(12) United States Patent
Kim

(10) Patent No.: US 7,224,073 B2
(45) Date of Patent: May 29, 2007

(54) SUBSTRATE FOR SOLDER JOINT

(75) Inventor: Sung-Jin Kim, Hsin-Chu (TW)

(73) Assignee: Ultratera Corporation (CN)

( * ) Notice: Subject to any disclaimer, the term of this patent is extended or adjusted under 35 U.S.C. 154(b) by 441 days.

(21) Appl. No.: 10/848,649

(22) Filed: May 18, 2004

(65) Prior Publication Data

US 2005/0258544 A1    Nov. 24, 2005

(51) Int. Cl.
*H01L 23/48* (2006.01)
(52) U.S. Cl. .................. 257/779; 257/738; 257/780; 257/E23.01
(58) Field of Classification Search ................ 257/737, 257/738, 773–776, 779–781, E23.01
See application file for complete search history.

(56) References Cited

U.S. PATENT DOCUMENTS 5,872,399 A * 2/1999 Lee ............................ 257/738

| | | | |
|---|---|---|---|
| 6,201,305 B1 | 3/2001 | Darveaux et al. | |
| 6,762,503 B2 * | 7/2004 | Lee | 257/781 |
| 7,005,750 B2 * | 2/2006 | Liu | 257/779 |

* cited by examiner

*Primary Examiner*—Marcos D. Pizarro
(74) *Attorney, Agent, or Firm*—Anderson Kill & Olick, PC

(57) ABSTRACT

A substrate for solder joint is provided, including: a core layer; at least one conductive trace formed on the core layer and having a circular terminal as a pad through which a plurality of hollow portions are formed and expose predetermined portions of the core layer underneath the pad, wherein the hollow portions are arranged at equal intervals and spaced from a periphery of the circular pad; and a solder mask for covering the conductive trace and having at least one opening bordered across each of the hollow portions of the pad, such that part of the pad and part of each of the predetermined portions of the core layer are exposed via the opening, to allow a conductive element to be bonded to the exposed part of the pad and the exposed part of the predetermined portions of the core layer in the opening of the solder mask.

9 Claims, 4 Drawing Sheets

SUBSTRATE FOR SOLDER JOINT

FIELD OF THE INVENTION

The present invention relates to substrates for solder joint, and more particularly, to a substrate having at least one bond pad thereon to which a solder ball or bump can be bonded.

BACKGROUND OF THE INVENTION

Substrate is a critical component for a semiconductor package, which usually serves as a chip carrier whose one side is mounted with at least one semiconductor chip that is electrically connected to conductive traces formed on the substrate. On an opposite side of the substrate there are also formed a plurality of conductive traces that are electrically coupled to the conductive traces on the side having the chip by means of conductive vias penetrating through the substrate. BGA (ball grid array) package is characterized in bonding an array of solder balls to the side opposite to the chip-mounting side of the substrate and electrically connecting the solder balls to the conductive traces on the substrate, and the solder balls can be further bonded to an external device such as printed circuit board (PCB). By this arrangement, the chip is electrically coupled through the conductive traces on both sides of the substrate and the solder balls to the PCB, such that the solder balls serve as input/output (I/O) connections for communicating the semiconductor package and the PCB and thereby play an important role.

The substrate is primarily composed of a core layer, a plurality of conductive traces formed on the core layer, and a solder mask applied over the conductive traces. In exemplification of the ball-bonding side of the substrate, once the core layer is prepared and made of a resin material such as epoxy resin, polyimide resin, BT (bismaleimide triazine) resin, FR4 resin, or FR5 resin, a film of copper or copper alloy is coated on a surface of the core layer and subject to a patterning process (including exposing, developing and etching, etc) to form the plurality of conductive traces in the core layer, each conductive trace having a terminal. Then, the solder mask is coated on the conductive traces while exposing the terminals. The exposed terminals form solder pads where the solder balls are bonded.

The solder pads are defined by a plurality of openings formed through the solder mask and corresponding to the terminals of the conductive traces. As shown in FIG. 5, a SMD (solder mask defined) pad 10 formed on the core layer 11 of the substrate 1 includes a predetermined part of the terminal 12 exposed via a corresponding opening 130 of the solder mask 13 which is sized smaller than the terminal 12. Solder is deposited over the pad 10 and reflowed to form a solder ball (or bump) 14 that is thus bonded and electrically connected to the substrate 1. Another type of solder pad is so-called NSMD (non-solder mask defined) pad 15, as shown in FIG. 6, formed by a corresponding opening 131 of the solder mask 13 which is sized larger than the terminal 12 to expose the entire terminal 12 and a portion of the core layer 11 around the terminal 12. As a result, the NSMD pad 15 includes the entirely exposed terminal 12 and the exposed portion of the core layer 11, allowing the solder ball 14 formed thereon to completely cover the terminal 12.

The SMD pad 10 for solder joint however renders significant drawbacks. The solder ball 14 mounted on the SMD pad 10, as in contact with relatively smaller area of the terminal 12, would easily lead to cracks at a neck or root portion thereof (as indicated by corrugated lines in FIG. 5) when the solder ball 14 is subject to external impact or shear force. With regard to the NSMD pad 15 on which the solder ball 14 covers the entire terminal 12, however, during a reflow process for forming the solder ball 14, solder deposited over the terminal 12 would melt under a high temperature and collapse to contact both the terminal 12 and the exposed portion of the core layer 11 around the terminal 12, as shown in FIG. 6. As a result, the fabricated solder balls 14 on different NSMD pads 15 may be tilted or hardly controlled with the height thereof depending on different degrees of solder collapse over the exposed core layer 11.

Another issue relates to resin flash during an encapsulation process for encapsulating the chip on the substrate in the use of a resin compound such as epoxy resin. This encapsulation process is usually performed before forming solder balls on the substrate. In other words, the substrate with its solder pads "naked" or exposed is placed in a cavity of a mold where the resin compound is injected to cover predetermined area (such as the chip-mounted side) on the substrate. However, it may occur that the mold, which is supposed to tightly abut against the side with solder pads on the substrate where no encapsulation is required, is not perfectly clamping this side of substrate and thus makes the resin compound leak or flash to this pad-forming side and contaminate the naked solder pads. In this case, the SMD pads and NSMD pads would all be undesirably contaminated by resin flash, while the SMD pads may encounter more serious flash over the terminals of conductive traces than the NSMD pads because the NSMD pad 15 (FIG. 6) has a recessed clearance (corresponding to the exposed portion of the core layer 11) between the solder mask 13 and the terminal 12, which recessed clearance may somewhat impede the movement of resin flash.

U.S. Pat. No. 6,201,305 discloses a type of solder pad that may increase contact area between the pad and a solder ball or bump mounted on the pad. As shown in FIG. 7, this solder pad 16 is fabricated by firstly etching the trace terminal 12 from the periphery toward the center of the terminal 12 to be shaped as a starfish having a plurality of radially-arranged spokes, and then forming an opening 132 through the solder mask 13 for exposing a predetermined portion of the starfish-shaped terminal 12 and a predetermined portion of the core layer 11 located between two adjacent spokes. Thereby, a solder ball or bump (not shown) deposited on the solder pad 16 comes into contact with both the exposed portions of the terminal 12 and the core layer 11, such that contact area between the pad 16 and the solder ball (or bump) is increased, which thereby secures the solder ball (or bump) strongly bonded to the pad 16 and not easy to crack in response to external impact or shear force.

However, a problem rendered by the above solder pad 16 is the difficulty in arranging such solder pads 16 in a fine pitch manner. For the fine pad pitch arrangement, which is advantageous for high chip integration, adjacent solder pads 16 or terminals 12 need to be closely situated and spaced from each other by a very small pitch distance, even as small as 0.5 mm, and this would make the particular starfish shape of the terminals 12 hard to be perfectly formed by the etching technique that is actually difficult to be performed from the periphery of terminals 12 very closely adjacent to each other, leading to undesirably etching results. The undesirable etching results may caused by, for example, inaccurate etching that forms imperfect starfish shape of the terminal 12 whose predetermined portion may not be completely exposed via the opening 132 of the solder mask 13; over etching that would etch out too much part of the terminal 12, making the remaining part of terminal 12 that is even exposed via the opening fail to provide sufficient bonding strength with the solder ball (or bump) formed thereon; or insufficient etching that may leave the etching-out part of terminal 12 not able to be exposed via the opening 132, such that the predetermined portion of the core layer 11 intended to be exposed via the etching-out part of terminal 12 cannot be exposed but remains covered by the solder mask 13, which also degrades the bondability between the solder pad 16 and the solder ball (or bump).

FIG. 8 illustrates another type of solder pad 17 similarly formed by etching, for which the trace terminal 12 is etched from the periphery toward the center thereof to form a cross that may serve as an air vent when the solder pad 17 bonded with a solder ball or bump (not shown) undergoes a reflow process, and then a predetermined portion of the core layer 11 exposed via the cross and four portions of the terminal 12 are exposed by an opening 133 formed through the solder mask 13. Besides the drawbacks discussed above for the solder pad 16 shown in FIG. 7, the present solder pad 17 of FIG. 8 further encounters a problem that the cross or air vent occupies relatively more area exposed via the opening 133, making the relatively less exposed portions of terminal 12 not able to firmly bonded with the solder ball (or bump), such that the bonding in-between may be easily destroyed by external force or impact.

Moreover, the solder pads shown in FIGS. 7 and 8 are easily subject to resin flash. During a molding process performed prior to ball implantation, a resin compound e.g. epoxy resin commonly used to encapsulate mounting components (such as chip, bonding wires, etc.) on the substrate may undesirably flash to the exposed solder pads (especially the exposed portion of the core layer) in the absence of a flash-preventing mechanism provided on the side of the substrate having the pads. The contaminated pads are not able to be perfectly bonded with solder balls or bumps, thereby damaging the quality of electrical connection between the pads and corresponding solder balls (or bumps).

Therefore, in response to the above drawbacks, the problem to be solved herein is to provide a substrate formed with pads for bonding solder balls or bumps, which can arrange the pads in a fine pitch manner, secure bondability between the pads and solder balls, and provide good resin-flash control.

SUMMARY OF THE INVENTION

An objective of the present invention is to provide a substrate for solder joint formed with a plurality of pads where solder balls or bumps can be bonded, wherein the pads can be arranged in a fine pitch manner.

Another objective of the invention is to provide a substrate for solder joint formed with a plurality of pads where solder balls or bumps can be bonded, which helps prevent resin flash from contaminating the pads during a molding process.

In accordance with the foregoing and other objectives, the present invention proposes a substrate for solder joint, comprising: a core layer; at least one conductive trace formed on a surface of the core layer and having a circular terminal that serves as a pad through which a plurality of hollow portions are formed and thereby expose predetermined portions of the core layer underneath the pad, wherein the hollow portions are arranged at equal intervals and spaced from a periphery of the circular pad; and a solder mask applied over the surface of the core layer for covering the conductive trace, and formed with at least one opening that corresponds in position to the circular pad and is sized smaller than the pad, the opening being bordered across each of the hollow portions of the pad, such that part of the pad and part of each of the predetermined portions of the core layer are exposed via the opening, while the rest part of the pad and the rest part of the predetermined portions of the core layer are covered by the solder mask, so as to allow a conductive element to be bonded to the exposed part of the pad and the exposed part of the predetermined portions of the core layer in the opening of the solder mask.

The foregoing substrate for solder joint yields significant benefits. First, the pads can be arranged in a fine pitch manner on the substrate. Due to the hollow portions being formed internally through the pads and free of contact with the periphery of the pads, the etching process for forming the internal hollow portions, not etching the pads from the periphery thereof, would be performed more easily and accurately than that for etching the conventional trace terminals from the periphery thereof in the prior art even if the pads are closely spaced from each other. Further, the substrate provides a flash prevention mechanism. When the substrate is subject to a molding process in which a resin compound such as epoxy resin is applied over the substrate to form an encapsulation body, an elevated portion of the solder mask situated around the opening and on the pad is elevated in height by the thickness of the underneath pad. As a result, during molding, when the resin compound flows to the elevated portion, it would decrease its flowing speed and fails to enter the opening and flash over the exposed part of the pad or core layer, such that the exposed pad and core layer are protected against contamination from resin flash, thereby assuring the bonding strength between the exposed pad and core layer and a solder ball (or bump) formed thereon. Moreover, the pad having the hollow portions are each partly exposed by an opening through the solder mask as well as the core layer is partly exposed via the opening to allow the solder ball (or bump) to be formed in the opening and in contact with both of the exposed pad and core layer. This would desirably increase contact area between the substrate and the solder ball (or bump), thereby securing the solder ball (or bump) strongly on the pad and not easy to crack in response to external impact or shear force. Besides, the exposed part of the pad and the exposed part of the core layer are predetermined in area by the opening of the solder mask, such that during a reflow process, solder applied in the opening would melt and collapse in a control manner over the exposed pad and core layer having the predetermined area to form the solder ball (or bump) which is thereby unlikely to tilt or have uneven height with respect to other solder balls (or bumps) bonded to other pads on the substrate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a substrate for solder joint proposed in the present invention are described with reference to FIGS. 1 to 4.

Figure 1:
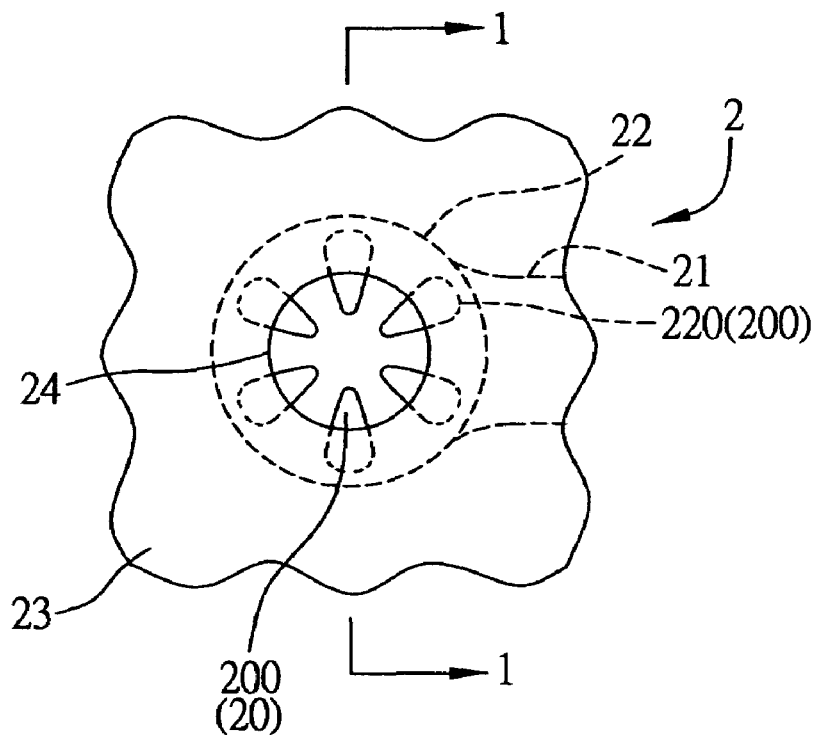
FIG. 1 is a top view of a substrate for solder joint according to a preferred embodiment of the invention.
Figure 3:
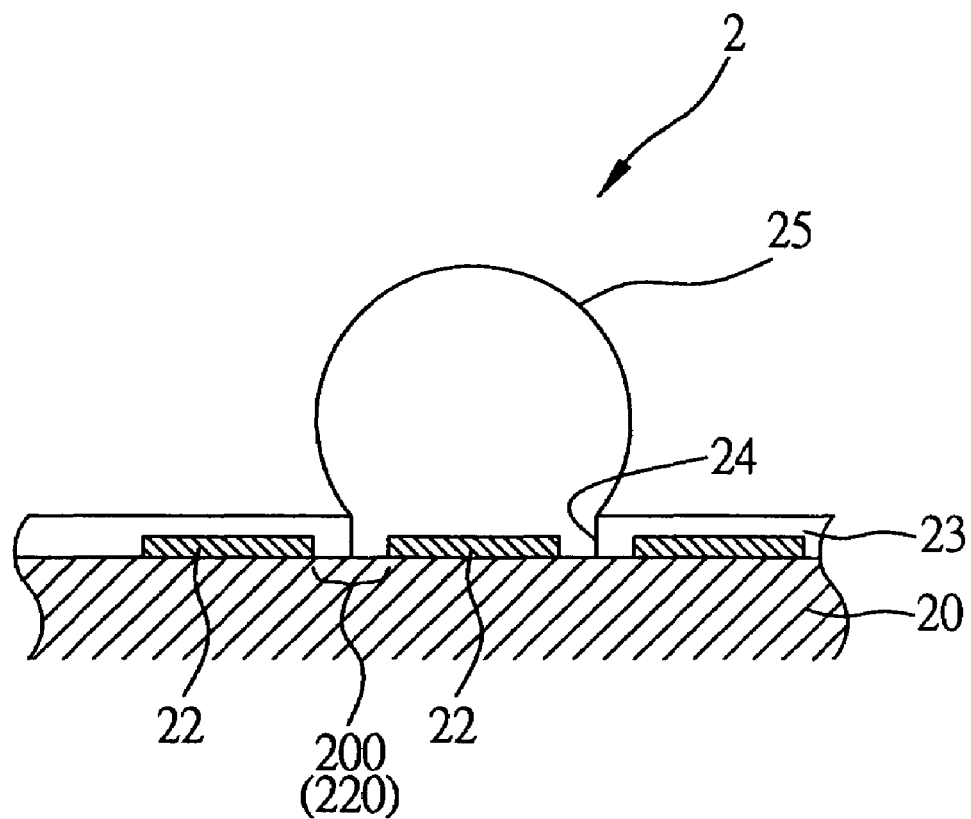
FIG. 3 is a cross-sectional view of the substrate shown in FIG. 1 along line 1-1 bonded with a solder ball.

As shown in FIGS. 1 and 3, a substrate 2 for solder joint according to the invention comprises: a core layer 20; at least one conductive trace 21 formed on a surface of the core layer 20 and having a circular terminal 22 that serves as a pad 22 (designated by the same reference numeral as the terminal 22) through which a plurality of hollow portions 220 are formed and thereby expose predetermined portions 200 of the core layer 20 underneath the pad 22; and a solder mask 23 applied over the surface of the core layer 20 for covering the conductive trace 21, and formed with at least one opening 24 via which part of the pad 22 and part of each predetermined portion 200 of the core layer 20 are exposed, such that a solder ball 25 (or bump) can be bonded to the exposed part of the pad 22 and the exposed part of each predetermined portion 200 of the core layer 20 in the opening 24 of the solder mask 23.

The substrate 2 is mainly composed of a core layer 20 that is primarily made of a conventional resin material such as epoxy resin, polyimide resin, BT (bismaleimide triazine) resin, FR4 resin, or FR5 resin. A film of copper or copper alloy is applied over at lease one surface of the core layer 20 and subject to a conventional patterning process (including exposing, developing, and etching, etc.) to form a plurality of conductive traces 21 (only one is shown in the drawings) on the core layer 20. Each of the conductive traces 21 has a circular terminal 22 that serves as a pad 22. A plurality of hollow portions 220 are formed e.g. by etching through the circular pad 22 and expose predetermined portions 200 of the core layer 20 situated underneath the pad 22. The hollow portions 220 are preferably arranged at equal intervals and spaced from a periphery of the pad 22; that is, the hollow portions 220 are located completely within the pad 22 and free of contact with the periphery of the pad 22. The hollow portions 220 may be or may not be symmetrically arranged (those shown in FIG. 1 are symmetrically arranged). In this embodiment, each hollow portion 220 of the pad 22 is oval in shape, and the tip end of the oval hollow portion 220 is directed toward the center of the pad 22.

Once fabrication of the conductive traces 21 with the pads 22 is complete, a solder mask 23 is applied over the surface of the core layer 20 and covers the conductive traces 21. The solder mask 23 is formed with a plurality of openings 24 (only one is shown in the drawings) each corresponding in position to one of the pads 22 and sized smaller than the corresponding pad 22. The opening 24 is bordered across each of the hollow portions 220 of the pad 22. And the opening 24 may be circular in shape in accordance with the circular pad 22. In respect of the one pad 22 shown in FIGS. 1 and 3, the opening 24 of the solder mask 23 allows part of the pad 22 and part of each of the predetermined portions 200 (exposed via the hollow portions 220 of the pad 22) of the core layer 20 to be exposed, while the rest part of the pad 22 and the rest part of the predetermined portions 200 of the core layer 20 remain covered by the solder mask 23. The exposed part of the predetermined portions 200 of the core layer 20 is located beside the tip ends of the oval hollow portions 220 of the pad 22 and thus relatively closer to the center of the pad 22. As a result, a solder ball 25 (or bump) can be bonded to the exposed part of the pad 22 and the exposed part of the predetermined portions 200 of the core layer 20 in the opening 24 of the solder mask 23 thereby forming a solder joint.

Figure 2:
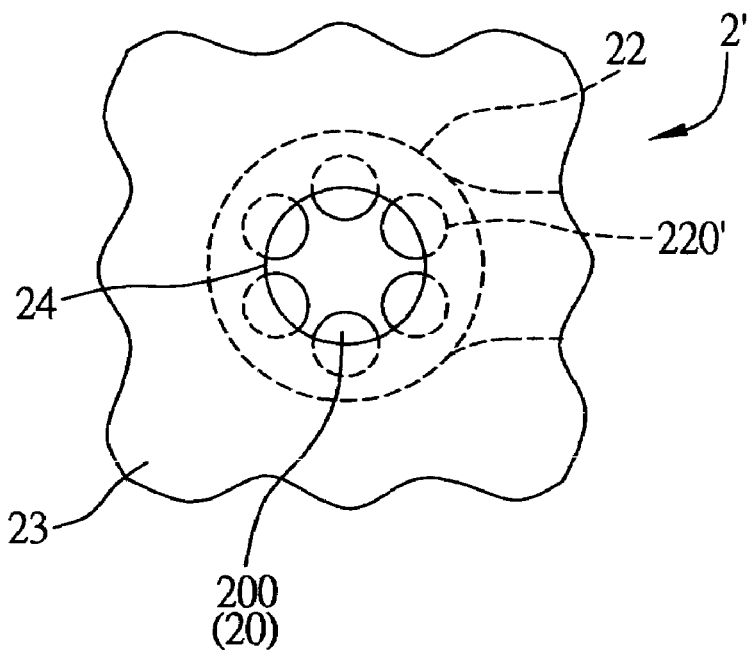
FIG. 2 is a top view of the substrate for solder joint according to another preferred embodiment of the invention.

In another embodiment shown in FIG. 2, the substrate 2' is structured mostly the same as the one described in the above embodiment, except that the hollow portions 220' formed through the pad 22 are each circular in shape. The opening 24 of the solder mask 23 is bordered across each circular hollow portion 220', such that part of the pad 22 and part of each predetermined portion 200 of the core layer 20 are exposed via the opening 24 and can be bonded with a solder ball or bump (not shown) to form a solder joint.

Figure 4:
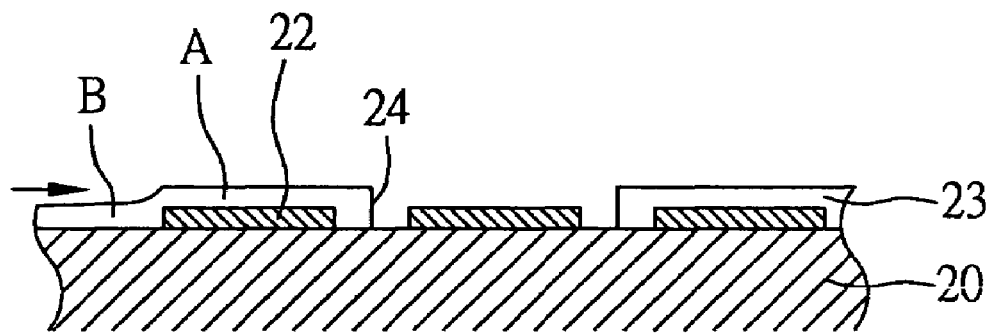
FIG. 4 is a cross-sectional view of the substrate shown in FIG. 1 during a molding process.
Figure 5:
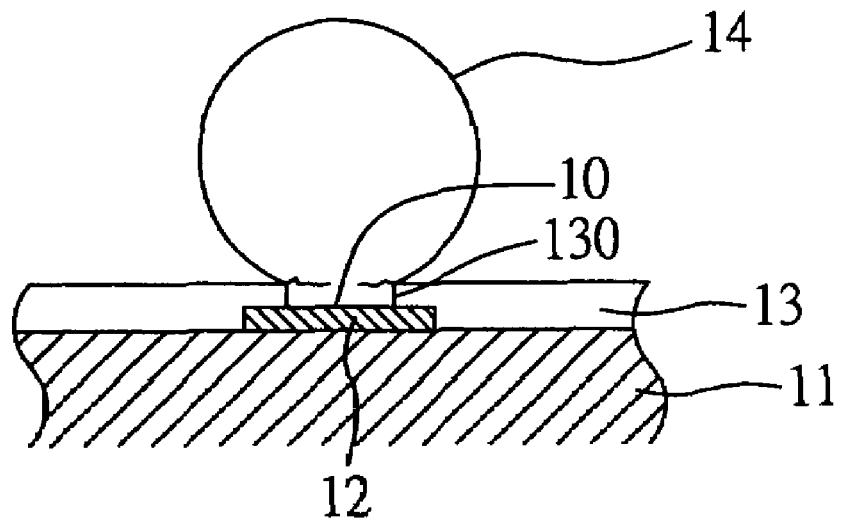
FIG. 5 (PRIOR ART) is a cross-sectional view of a SMD solder pad bonded with a solder ball.
Figure 6:
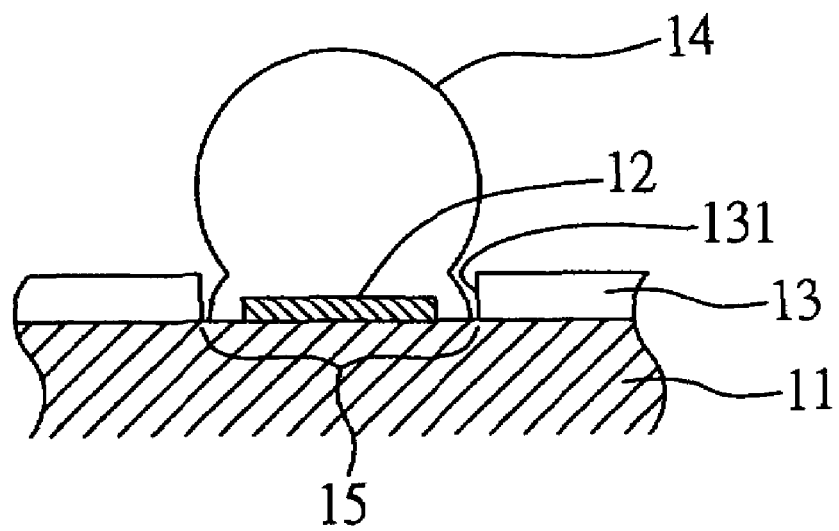
FIG. 6 (PRIOR ART) is a cross-sectional view of a NSMD solder pad bonded with a solder ball.
Figure 7:
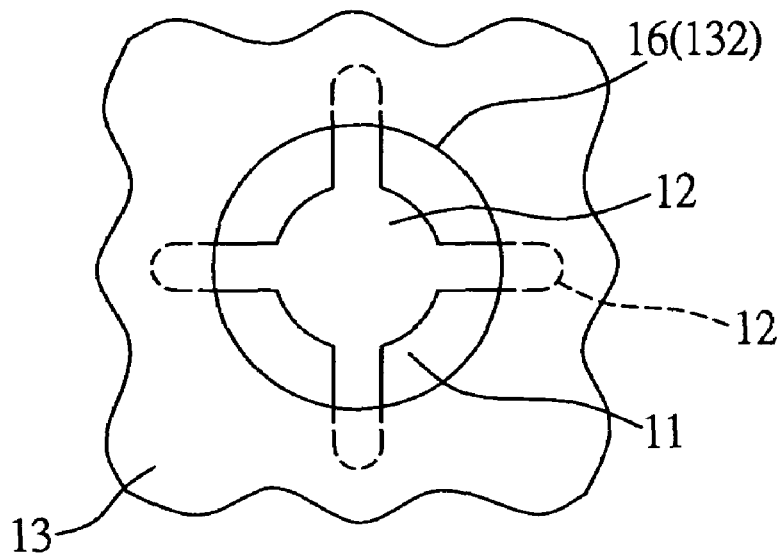
FIG. 7 (PRIOR ART) is a top view of a solder pad disclosed by U.S. Pat. No. 6,201,305.
Figure 8:
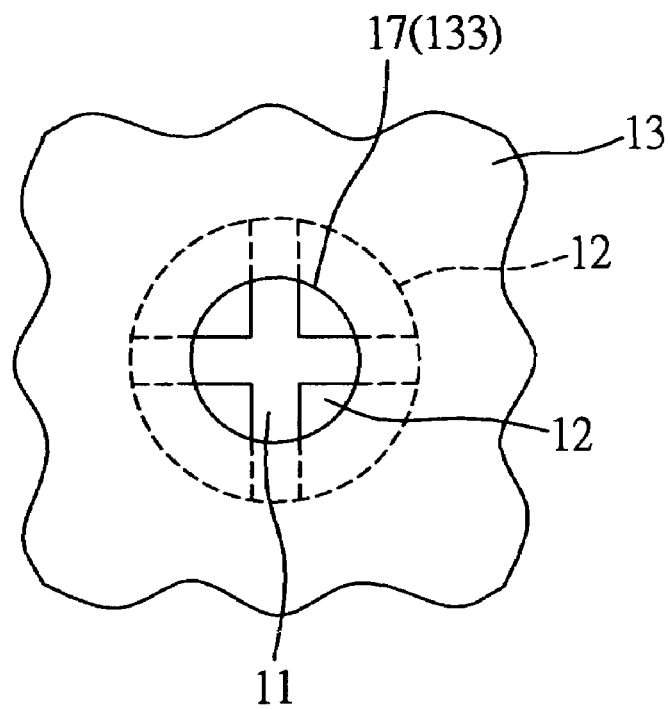
FIG. 8 (PRIOR ART) is a top view of a conventional solder pad with an air vent.

Moreover, the above substrate 2, 2' provides a flash prevention mechanism. In exemplification of the substrate 2, as shown in FIG. 4, when the substrate 2 is subject to a molding process in which a resin compound such as epoxy resin (as indicated by the arrow in the drawing) is applied over the substrate 2 to form an encapsulation body, a portion A of the solder mask 23 situated around the opening 24 and on the pad 22 is elevated higher by the thickness of the underneath pad 22 than a portion B of the solder mask 23 located on the core layer 20 around the pad 22. As a result, during molding, when the resin compound flows to the portion B, it would decrease its flowing speed as approaching the elevated portion A and thus fails to go over the portion A to enter the opening 24 and flash over the exposed part of the pad 22 or core layer 20, such that the exposed pad 22 and core layer 20 are protected against contamination from resin flash, thereby assuring the bonding strength between the exposed pad 22 and core layer 20 and a solder ball (or bump) formed thereon.

Besides the flash control mechanism, the foregoing substrate for solder joint further yields significant benefits. First, the pads can be arranged in a fine pitch manner on the substrate. Due to the hollow portions being formed internally through the pads and free of contact with the periphery of the pads, the etching process for forming the internal hollow portions, not etching the pads from the periphery thereof, would be performed more easily and accurately than that for etching the conventional trace terminals from the periphery thereof in the prior art even if the pads are closely spaced from each other. Moreover, the pad having the hollow portions are each partly exposed by an opening through the solder mask as well as the core layer is partly exposed via the opening to allow the solder ball (or bump) to be formed in the opening and in contact with both of the exposed pad and core layer. This would desirably increase contact area between the substrate and the solder ball (or bump), thereby securing the solder ball (or bump) strongly on the pad and not easy to crack in response to external impact or shear force. Further, the exposed part of the pad and the exposed part of the core layer are predetermined in area by the opening of the solder mask, such that during a reflow process, solder applied in the opening would melt and collapse in a control manner over the exposed pad and core layer having the predetermined area to form the solder ball (or bump) which is thereby unlikely to tilt or have uneven height with respect to other solder balls (or bumps) bonded to other pads on the substrate.

The invention has been described using exemplary preferred embodiments. However, it is to be understood that the scope of the invention is not limited to the disclosed embodiments. On the contrary, it is intended to cover various modifications and similar arrangements. For example, the substrate can also be a semiconductor substrate or chip formed with the pad for bump connection. The scope of the claims, therefore, should be accorded the broadest interpretation so as to encompass all such modifications and similar arrangements.

What is claimed is:

1. A substrate for solder joint, comprising:

a core layer;

at least one conductive trace formed on a surface of the core layer and having a circular terminal that serves as a pad through which a plurality of hollow portions are formed and thereby expose predetermined portions of the core layer underneath the pad, wherein the hollow portions are arranged at equal intervals and spaced from a periphery of the circular pad; and a solder mask applied over the surface of the core layer for covering the conductive trace, and formed with at least one opening that corresponds in position to the circular pad and is sized smaller than the pad, the opening being bordered across each of the hollow portions of the pad, such that part of the pad and part of each of the predetermined portions of the core layer are exposed via the opening, while the rest part of the pad and the rest part of the predetermined portions of the core layer are covered by the solder mask, so as to allow a conductive element to be bonded to the exposed part of the pad and the exposed part of the predetermined portions of the core layer in the opening of the solder mask.

2. The substrate of claim 1, wherein the hollow portion is circular.

3. The substrate of claim 1, wherein the opening of the solder mask is circular.

4. The substrate of claim 1, wherein the core layer is made a resin material selected from the group consisting of epoxy resin, polyimide resin, BT (bismaleimide triazine) resin, FR4 resin, and FR5 resin.

5. The substrate of claim 1, wherein the conductive trace is made of copper or copper alloy.

6. The substrate of claim 1, wherein the conductive element is a solder ball or bump.

7. The substrate of claim 1, wherein the hollow portion of the pad is oval.

8. The substrate of claim 7, wherein the oval hollow portion has its tip end directed toward the center of the pad.

9. The substrate of claim 8, wherein the exposed part of the predetermined portion of the core layer is located beside the tip end of the hollow portion and thus relatively closer to the center of the pad.

* * * * *